(12) United States Patent
Chuang

(10) Patent No.: US 12,745,462 B2
(45) Date of Patent: Sep. 22, 2026

(54) ELECTROSTATIC DISCHARGE PROTECTION DEVICE

(71) Applicant: ALi Corporation, Hsinchu (TW)

(72) Inventor: Sheng-Jun Chuang, Hsinchu (TW)

(73) Assignee: ALi Corporation, Hsinchu (TW)

( * ) Notice: Subject to any disclaimer, the term of this patent is extended or adjusted under 35 U.S.C. 154(b) by 365 days.

(21) Appl. No.: 18/511,983

(22) Filed: Nov. 16, 2023

(65) Prior Publication Data

US 2024/0355807 A1 Oct. 24, 2024

(30) Foreign Application Priority Data

Apr. 21, 2023 (CN) ......................... 202310436171.8

(51) Int. Cl.
*H10D 89/60* (2025.01)
*H10D 8/00* (2025.01)

(52) U.S. Cl.
CPC ............... *H10D 89/60* (2025.01); *H10D 8/00* (2025.01)

(58) Field of Classification Search
CPC ........ H10D 89/611; H10D 89/60; H10D 8/60; H10D 62/106; H10D 84/991; H10D 84/038; H10D 8/051; H10D 84/403; H10D 30/603; H10D 62/115; H10D 84/811; H10D 84/0109; H10D 62/378; H10D 62/371; H10D 30/0221; H10D 84/854; H10D 62/116; H10D 62/126; H10D 62/158; H10D 84/154; H10D 62/393; H10D 62/154; H10D 30/657; H10D 84/153; H10D 64/111; H10D 62/127; H01L 21/761; H01L 21/76283; H01L 2924/0002; H03K 17/0814; H03K 17/102
See application file for complete search history.

(56) References Cited

U.S. PATENT DOCUMENTS

| | | | | |
|---|---|---|---|---|
| 6,163,052 | A * | 12/2000 | Liu ........................ | H10D 86/01 257/334 |
| 7,804,671 | B2 | 9/2010 | Cheng et al. | |
| 9,673,187 | B2 | 6/2017 | Salcedo et al. | |
| 9,761,707 | B1 * | 9/2017 | Lin ...................... | H10D 84/811 |

(Continued)

FOREIGN PATENT DOCUMENTS

| | | |
|---|---|---|
| CN | 106057795 A | 10/2016 |
| CN | 107240585 A | 10/2017 |

(Continued)

*Primary Examiner* — Mouloucoulaye Inoussa

(57) ABSTRACT

Disclosed is an electrostatic discharge protection device, which includes a first-type semiconductor substrate, a first diode including a first first-type well and a first second-type well, a second diode including a second first-type well and a second second-type well, a first isolation structure and a second isolation structure. An upper surface of the first-type semiconductor substrate includes a first region where the first diode is formed, a second region where the second diode is formed and a third region located between the first region and the second region. The first isolation structure is formed on the third region to isolate the first diode from the second diode. The first first-type well is electrically connected to the second second-type well through a metal wire above the first isolation structure. The second isolation structure is located under the first first-type well to isolate the first first-type well from the first region.

11 Claims, 8 Drawing Sheets

(56) References Cited

U.S. PATENT DOCUMENTS 10,944,001 B1 * 3/2021 Zhang .................. H10D 62/116
2004/0135141 A1 * 7/2004 Pequignot ............ H10D 89/611 257/46
2011/0176243 A1 * 7/2011 Zhan .................... H10D 89/711 257/E21.608
2012/0288083 A1 * 11/2012 Sun ........................ H10D 8/043 257/774
2013/0122677 A1 * 5/2013 Esmark ................... H01L 23/60 438/361
2014/0126091 A1 * 5/2014 Gill ........................ H02H 9/044 438/328
2014/0159108 A1 * 6/2014 Marreiro ................ H10D 89/60 257/140
2015/0137305 A1 * 5/2015 Schmenn ............. H10D 89/611 257/491
2015/0138678 A1 * 5/2015 Parthasarathy ........ H02H 9/046 361/56
2016/0181236 A1 * 6/2016 Hung ................... H10D 89/611 257/491
2016/0276335 A1 * 9/2016 Laine ................... H10D 89/713
2017/0077296 A1 * 3/2017 Yang .................. H10D 30/0221
2018/0342499 A1 * 11/2018 Mallikarjunaswamy .................... H10D 89/713
2019/0103396 A1 * 4/2019 Zhan .................... H10D 62/133
2019/0259749 A1 * 8/2019 Ishii ..................... H10D 84/038
2019/0312026 A1 * 10/2019 Zhan ...................... H02H 9/046
2020/0035665 A1 * 1/2020 Chuang ................ H10D 89/611
2020/0403103 A1 * 12/2020 Pjencak ................... H10D 8/00
2021/0082906 A1 * 3/2021 Peng .................... H10D 89/611
2023/0044360 A1 * 2/2023 Zhao ........................ H10D 8/60
2023/0223398 A1 * 7/2023 Chen .................... H10D 89/713 257/355

FOREIGN PATENT DOCUMENTS

CN 107346769 A 11/2017
CN 114725088 A 7/2022

* cited by examiner

ELECTROSTATIC DISCHARGE PROTECTION DEVICE

CROSS REFERENCE TO RELATED PRESENT DISCLOSURE

This application claims the priority benefit of Chinese Patent Application Serial Number 202310436171.8, filed on Apr. 21, 2023, the full disclosure of which is incorporated herein by reference.

BACKGROUND

Technical Field

The present disclosure relates to the technical field of circuit protection, in particular to an electrostatic discharge protection device.

Related Art

With the development of science and technology, the area of an integrated circuit gets more smaller, and the integrated circuit becomes faster and more powerful, so that the integrated circuit is more sensitive to electrostatic discharge (ESD). In order to avoid the electrical overstress on the integrated circuit due to ESD, an ESD protection device is usually used to protect the integrated circuit.

However, the ESD protection device in the prior art usually uses a MOS tube as an ESD protection component, so that there are problems that the ESD protection device is not suitable for a high-speed input/output (I/O) port of the integrated circuit due to a large parasitic capacitance value, and that the ESD protection component is burned due to a large reverse voltage value.

Therefore, how to provide an ESD protection device suitable for the integrated circuit is a problem that those skilled in the art need to solve.

SUMMARY

The embodiments of the present disclosure provide an ESD protection device, which can solve the problems that the ESD protection device in the prior art is not suitable for a high-speed input/output (I/O) port of the integrated circuit due to a large parasitic capacitance value, and that an ESD protection component is burned due to a large reverse voltage value since the ESD protection device usually uses a MOS tube as the ESD protection component.

In order to solve the above-mentioned technical problems, the present disclosure is implemented as follows:

The present disclosure provides an ESD protection device suitable for an integrated circuit including an input/output pad and a first power supply voltage terminal. The ESD protection device includes a first-type semiconductor substrate, a first diode, a second diode, a first isolation structure and a second isolation structure. An upper surface of the first-type semiconductor substrate includes a first region, a second region and a third region, and the third region is located between the first region and the second region. The first diode is formed above the first region, the first diode includes a first first-type well and a first second-type well, the first second-type well is formed on a part of the first first-type well, and the first second-type well is connected to the input/output pad. The second diode is formed on the second region, the second diode includes a second first-type well and a second second-type well, the second second-type well is formed on a part of the second first-type well, and the second first-type well contacts the second region and is connected to the first power supply voltage terminal. The first isolation structure is formed on the third region to isolate the first diode and the second diode, and the first first-type well is electrically connected to the second second-type well through a metal wire above the first isolation structure. The second isolation structure is formed in the upper surface of the first-type semiconductor substrate and located under the first first-type well to isolate the first first-type well from the first region.

In the electrostatic discharge protection device of the embodiment of the present disclosure, the first diode is electrically connected to the second diode through the metal wire above the first isolation structure (that is, the first diode and the second diodes are connected in series), so that the ESD protection device has a lower parasitic capacitance value, which is suitable for the high-speed I/O port of the integrated circuit. In addition, the first diode is connected to the input/output pad of the integrated circuit through the first second-type well, and the second diode is connected to the first power supply voltage terminal of the integrated circuit through the second first-type well, so that the reverse breakdown voltage of the ESD protection device becomes larger, which improves the ESD protection capability. Moreover, by setting the second isolation structure, the first first-type well is isolated from the first region (that is, the first first-type well is isolated from the first-type semiconductor substrate), so that the conduction between the first diode and the second diode through the first-type semiconductor substrate is avoided, and the problem of low charge-device model (CDM) performance is solved.

BRIEF DESCRIPTION OF THE DRAWINGS

Accompanying drawings described herein are intended to provide a further understanding of the present disclosure and form a part of the present disclosure, and exemplary embodiments of the present disclosure and descriptions thereof are intended to explain the present disclosure but are not intended to unduly limit the present disclosure. In the drawings.

DETAILED DESCRIPTION OF THE EMBODIMENTS

The embodiments of the present disclosure will be described below in conjunction with the relevant drawings.

In the figures, the same reference numbers refer to the same or similar components or method flows.

It must be understood that the words "including", "comprising" and the like used in this specification are used to indicate the existence of specific technical features, values, method steps, work processes, elements and/or components. However, it does not exclude that more technical features, values, method steps, work processes, elements, components, or any combination of the above can be added.

It must be understood that when an element is described as being "connected" or "coupled" to another element, it may be directly connected or coupled to another element, and intermediate elements therebetween may be present. In contrast, when an element is described as "directly connected" or "directly coupled" to another element, there is no intervening element therebetween.

In addition, although the terms such as "first", "second", etc., are used herein to describe different elements or operations, these terms are only used to distinguish elements or operations described with the same technical terms.

Besides, for convenience of description, spatially relative terms such as "below", "under", "above", "over", etc., may be used herein to describe the relationship between one element or feature and another (one or more) element(s) or feature(s) as shown in the figures.

Figure 2:
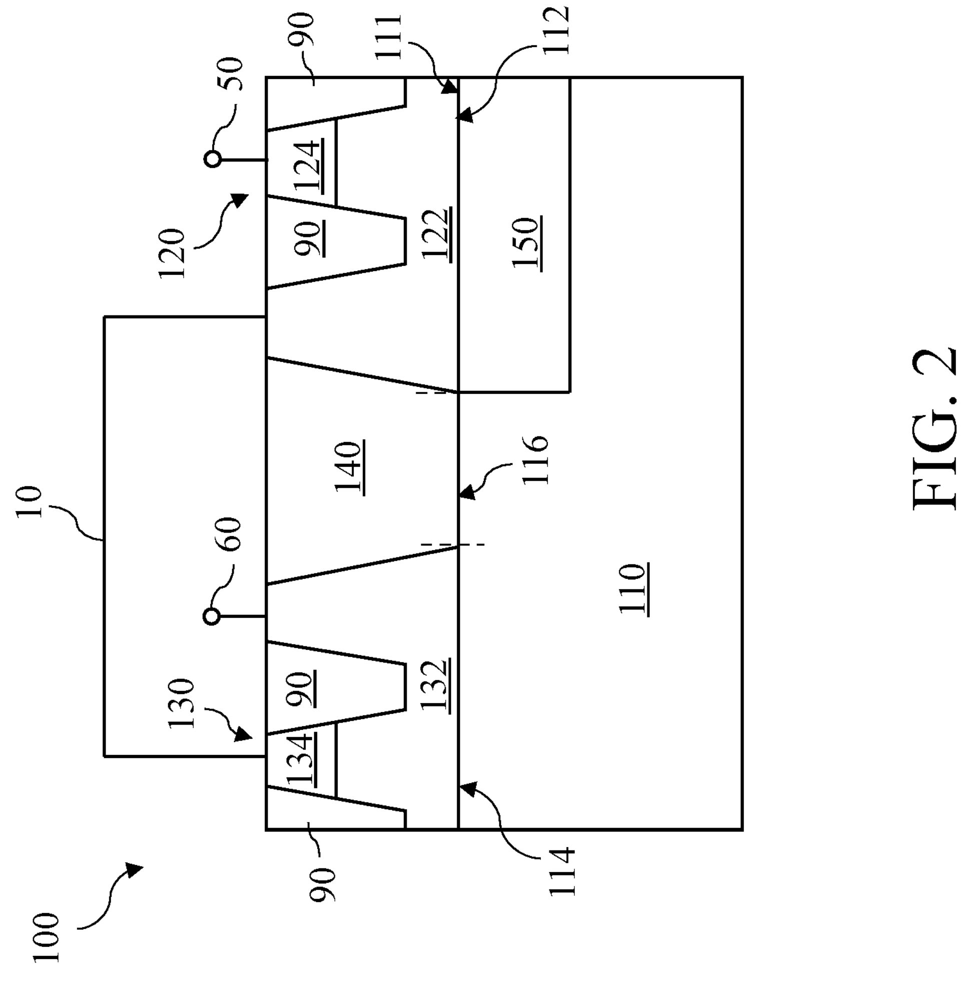
FIG. 2 is a cross-sectional diagram of an embodiment of the ESD protection device of FIG. 1.
Figure 1:
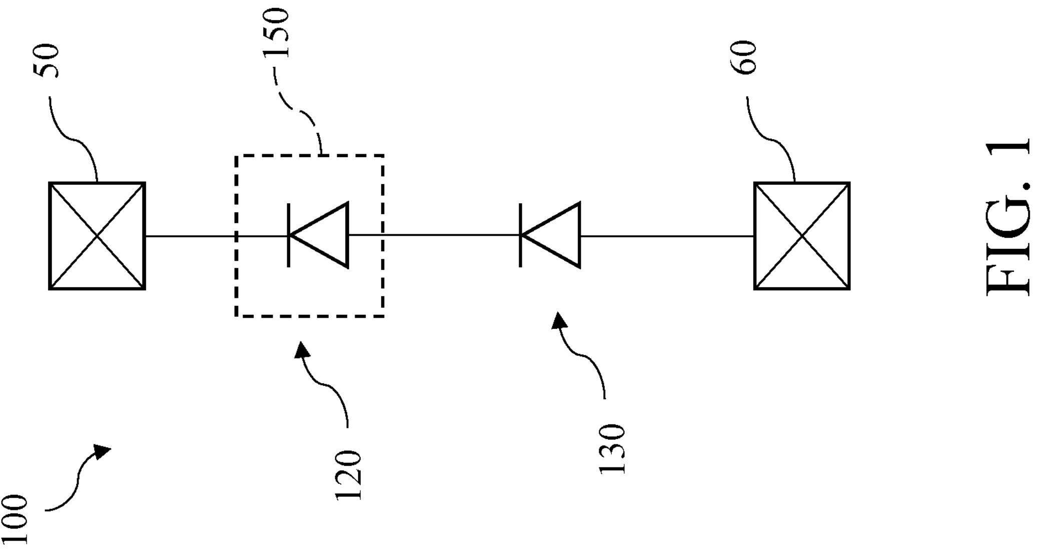
FIG. 1 is an equivalent circuit diagram of an ESD protection device according to an embodiment of the present disclosure which connecting to an input/output pad and a first power supply voltage terminal of an integrated circuit.

Please refer to FIG. 1 and FIG. 2, wherein FIG. 1 is an equivalent circuit diagram of an ESD protection device according to an embodiment of the present disclosure which connecting to an input/output pad and a first power supply voltage terminal of an integrated circuit, and FIG. 2 is a cross-sectional diagram of an embodiment of the ESD protection device of FIG. 1. As shown in FIG. 1 and FIG. 2, the ESD protection device 100 is suitable for an integrated circuit (not shown), and the integrated circuit includes an input/output pad 50 and a first power supply voltage terminal 60, wherein the first power supply voltage terminal 60 is a power supply voltage bus or rail, the first power supply voltage terminal 60 is configured to receive a first power supply voltage for normal operation of an internal circuit (not shown) of the integrated circuit, the first power supply voltage is a ground voltage, the first power supply voltage terminal 60 is a ground voltage terminal, and the first power supply voltage terminal 60 is also referred to as VSS; the input/output pad 50 is a node, a bus, or a probe that is coupled to the internal circuit (not shown) of the integrated circuit, and inputs signals to or outputs signals from the internal circuit of the integrated circuit.

In this embodiment, the ESD protection device 100 comprises a first-type semiconductor substrate 110, a first diode 120, a second diode 130, a first isolation structure 140, and a second isolation structure 150. An upper surface 111 of the first-type semiconductor substrate 110 comprises a first region 112, a second region 114 and a third region 116, and the third region 116 is located between the first region 112 and the second region 114. The first diode 120 is formed above the first region 112, the first diode 120 comprises a first first-type well 122 and a first second-type well 124, the first second-type well 124 is formed on a part of first first-type well 122, and the first second-type well 124 is connected to the input/output pad 50. The second diode 130 is formed on the second region 114, the second diode 130 comprises a second first-type well 132 and a second second-type well 134, the second second-type well 134 is formed a part of the second first-type well 132, and the second first-type well 132 contacts the second region 114 and is connected to the first power supply voltage terminal 60. The first isolation structure 140 is formed on the third region 116 to isolate the first diode 120 and the second diode 130, and the first first-type well 122 is electrically connected to the second second-type well 134 through a metal wire 10 above the first isolation structure 140, wherein the first isolation structure 140 may be but not limited to a trench isolation structure.

Therefore, the first diode 120 is electrically connected to the second diode 130 through the metal wire 10 above the first isolation structure 140 (that is, the first diode 120 and the second diode 130 are connected in series), so that the ESD protection device 100 has a lower parasitic capacitance value, which is suitable for a high-speed I/O port of the integrated circuit. In addition, the first diode 120 is connected to the input/output pad 50 through the first second-type well 124, and the second diode 130 is connected to the first power supply voltage terminal 60 through the second first-type well 132, so that the reverse breakdown voltage of the ESD protection device 100 becomes larger, which improves the ESD protection capability.

In this embodiment, the second isolation structure 150 is formed in the upper surface 111 of the first-type semiconductor substrate 110, and located under the first first-type well 122, so as to isolate the first first-type well 122 and the first region 112 (that is, the first first-type well 122 is isolated from the first-type semiconductor substrate 110).

The first first-type well 122 of the first diode 120 and the second first-type well 132 of the second diode 130 are configured in the same layer, and the first first-type well 122 and the second first-type well 132 are disposed above the first-type semiconductor substrate 110, so that the first first-type well 122 is isolated from the first-type semiconductor substrate 110 by setting the second isolation structure 150 to avoid the conduction between the first diode 120 and the second diode 130 through the first-type semiconductor substrate 110, and increase the electrostatic protection function of the ESD protection device 100 in the CDM.

In this embodiment, the first-type can be P-type (that is, the first-type semiconductor substrate 110 is a P-type semiconductor substrate, the first first-type well 122 is a first P-type well and the second first-type well 132 is a second P-type well), and the second-type can be N-type (that is, the first second-type well 124 is a first N-type well, and the second second-type well 134 is a second N-type well). In another embodiment, the first-type can be N-type, and the second-type can be P-type.

In one embodiment, since the first second-type well 124 is connected to the input/output pad 50, and the second first-type well 132 contacts the second region 114 and is connected to the first power supply voltage terminal 60, a first voltage applied by the integrated circuit to the first second-type well 124 of the first diode 120 through the input/output pad 50 may be greater than a second voltage applied by the integrated circuit to the second first-type well 132 of the second diode 130 through the first power supply voltage terminal 60.

In one embodiment, the second isolation structure 150 may be but not limited to a second-type deep well. That is to say, the second isolation structure 150 may be a deep N-well (DNW).

In one embodiment, the second isolation structure 150 does not extend to between the second first-type well 132 and the second region 114. In other words, the bottom of the first first-type well 122 is contacted with the second isolation structure 150, and the second isolation structure 150 is not disposed under the second first-type well 132, so as to avoid the conduction between the first diode 120 and the second diode 130 through the second isolation structure 150, increase the electrostatic protection function of the ESD protection device 100 in the CDM, thereby increasing the yield rate of the integrated circuits using the ESD protection devices 100.

Figure 3:
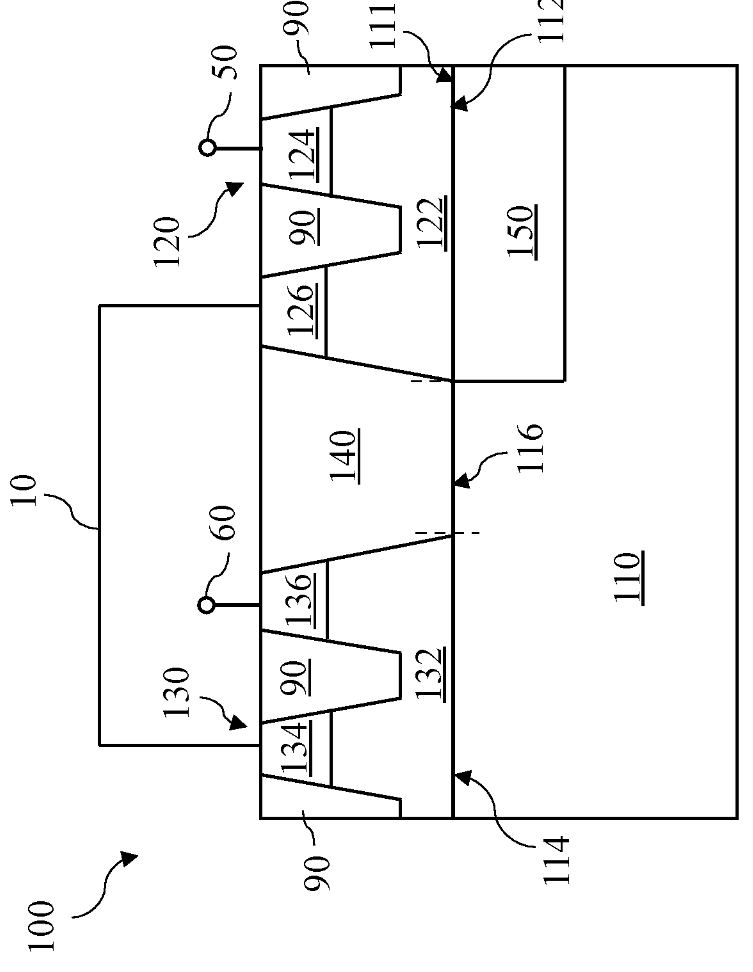
FIG. 3 is a cross-sectional diagram of another embodiment of the ESD protection device of FIG. 1.

In one embodiment, the first first-type well 122 may comprise a first first-type heavily-doped implanted region 126, and the first first-type heavily-doped implanted region 126 and the second second-type well 134 are electrically connected through the metal wire 10 above the first isolation structure 140, as shown in FIG. 3, which is a cross-sectional diagram of another embodiment of the ESD protection device of FIG. 1. The setting of the first first-type heavily-doped implanted region 126 is used to reduce the contact resistance between the first first-type well 122 and the second second-type well 134.

In one embodiment, a shallow trench isolation (STI) structure 90 is disposed between the first first-type heavily-doped implanted region 126 and the first second-type well 124 as shown in FIG. 3.

In one embodiment, the second first-type well 132 may comprise a second first-type heavily-doped implanted region 136, a shallow trench isolation structure 90 is disposed between the second first-type heavily-doped implanted region 136 and the second second-type well 134, and the integrated circuit applies a second voltage to the second first-type heavily-doped implanted region 136 of the second diode 130 through the first power supply voltage terminal 60, as shown in FIG. 3. The setting of the second first-type heavily-doped implanted region 136 is used to reduce the contact resistance.

Figure 4:
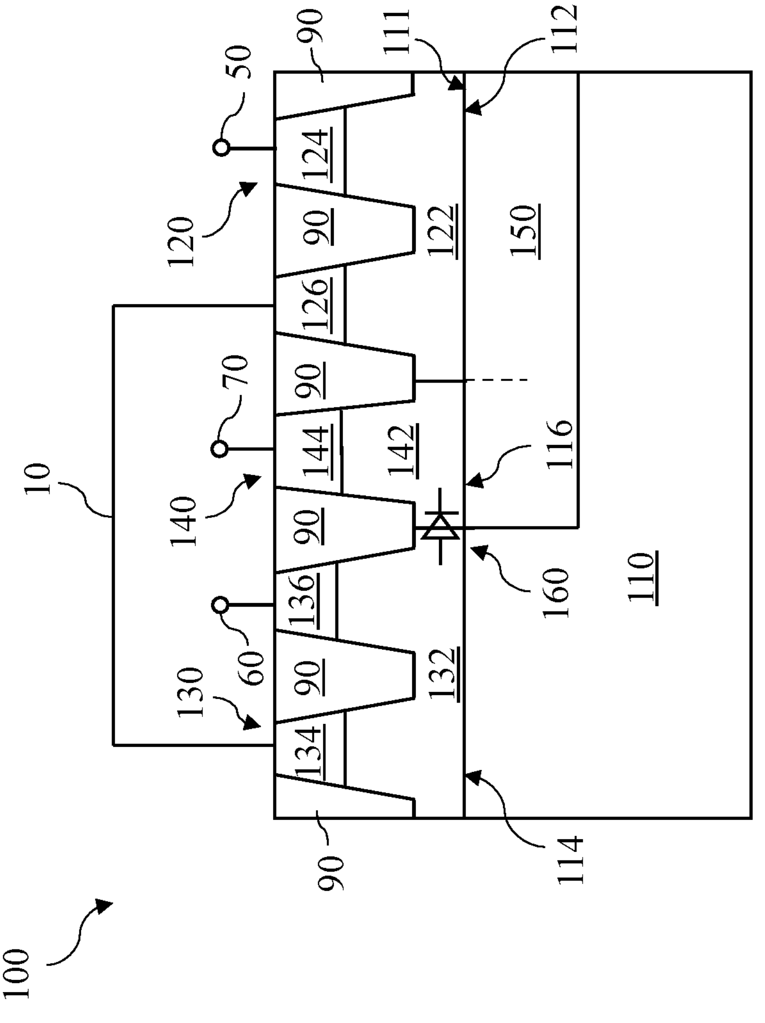
FIG. 4 is a cross-sectional diagram of an ESD protection device provided with a parasitic diode according to an embodiment of the present disclosure.

Please refer to FIG. 4, which is a cross-sectional diagram of an ESD protection device provided with a parasitic diode according to an embodiment of the present disclosure. As shown in FIG. 4, the difference between the cross-sectional diagram of FIG. 4 and the cross-sectional diagram of FIG. 3 is that the first isolation structure 140 may comprise a second-type well 142 and a second-type heavily-doped implanted region 144 formed on the second-type well 142. The second-type well 142 is immediately adjacent to the first first-type well 122 and the second first-type well 132, each of two sides of the second-type heavily-doped implanted region 144 is provided with a shallow trench isolation structure 90 to isolate the second-type heavily-doped implanted region 144 from the first first-type well 122 and the second first-type well 132, and the second-type well 142 and the second first-type well 132 form a parasitic diode. The integrated circuit further comprises a second power supply voltage terminal 70, and the second-type heavily-doped implanted region 144 is connected to the second power supply voltage terminal 70 of the integrated circuit, wherein the second power supply voltage terminal 70 is a power supply voltage bus or rail, the second power supply voltage terminal 70 is configured to receive a second power supply voltage for the normal operation of an internal circuit of the integrated circuit, the second power supply voltage is a positive power supply voltage, the second power supply voltage terminal 70 is a positive voltage terminal, and the second power supply voltage terminal 70 is also referred to as VDD.

The setting of the second-type heavily-doped implanted region 144 is used to reduce the contact resistance. In addition, by setting the parasitic diode 160 connected to the second power supply voltage terminal 70, there is another current discharge path to increase the electrical performance of the ESD protection device 100. Besides, by disposing the parasitic diode 160 between the first diode 120 and the second diode 130, in addition to avoiding that the first diode 120 and the second diode 130 share the same first-type well (that is, the second-type well 142 is disposed between the first first-type well 122 and the second first-type well 132), the circuit space can be fully utilized for the most efficient design.

In one embodiment, a third voltage applied by the integrated circuit to the second-type heavily-doped implanted region 144 of the first isolation structure 140 through the second power supply voltage terminal 70 is greater than a first voltage applied by the integrated circuit to the first second-type well 124 of the first diode 120 through the input/output pad 50.

In one embodiment, the first second-type well 124 of the first diode 120 and the first first-type heavily-doped implanted region 126 are exposed on a surface at the same level.

In one embodiment, the second second-type well 134 of the second diode 130 and the second first-type heavily-doped implanted region 136 are exposed on a surface at the same level.

Figure 5:
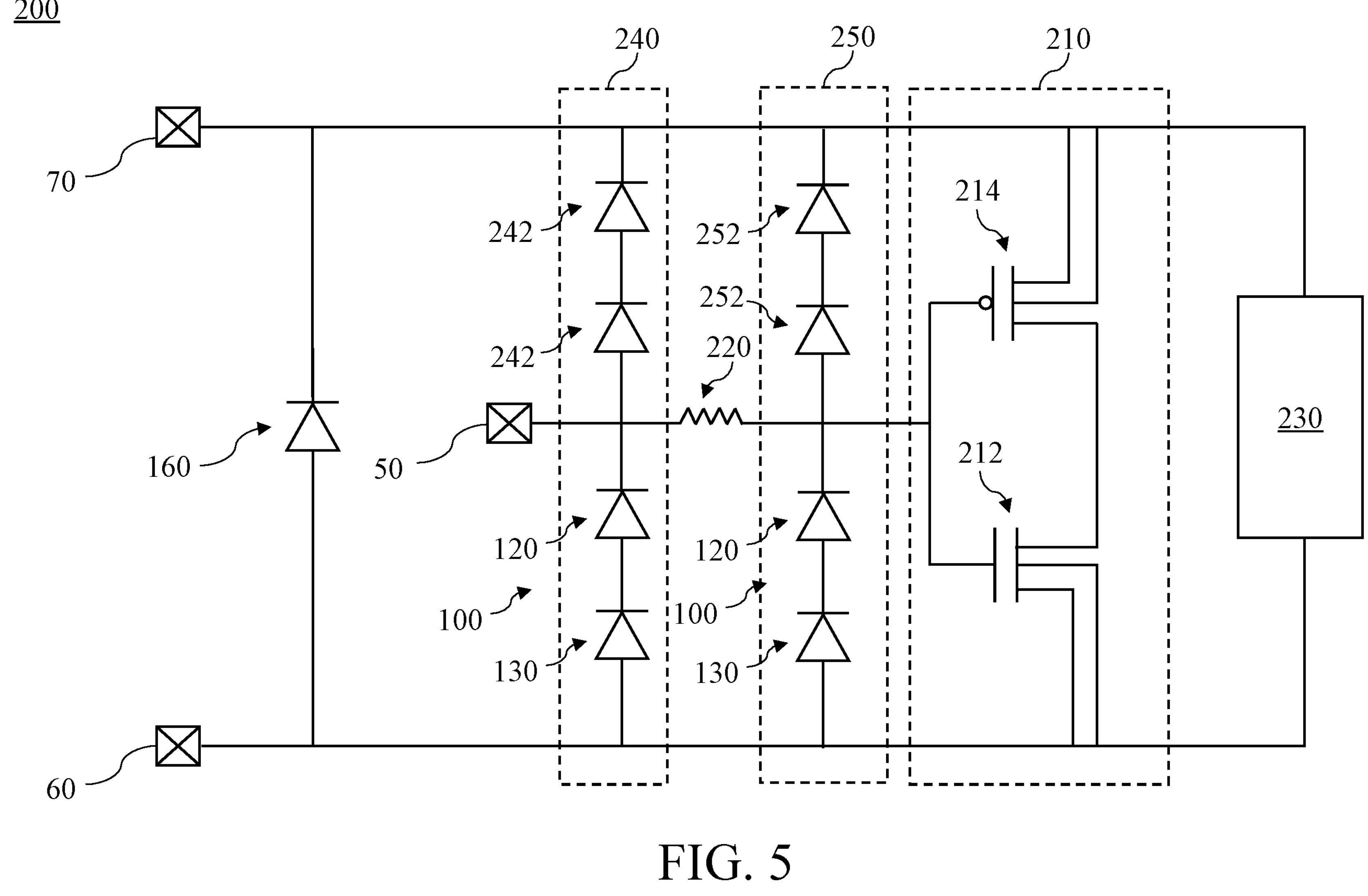
FIG. 5 is a circuit diagram of an integrated circuit applying an ESD protection device according to an embodiment of the present disclosure.

The following is an ESD capability test for the integrated circuit 200 to which the ESD protection device 100 of the present disclosure is applied, wherein the integrated circuit 200 may comprise an input/output pad 50, a first power supply voltage terminal 60, a second power supply voltage terminal 70, a parasitic diode 160, an internal circuit 210, a current-limiting resistor 220, a power clamp 230, a first-stage ESD protection circuit 240 and a second-stage ESD protection circuit 250, as shown in FIG. 5, which a circuit diagram of an integrated circuit applying an ESD protection device according to an embodiment of the present disclosure.

The internal circuit 210 is coupled to the first power supply voltage terminal 60 and the second power supply voltage terminal 70, and comprises the circuit(s) configured to generate or process the signal(s) output or input via the input/output pad 50. In one embodiment, the internal circuit 210 comprises a core circuit configured to operate at a voltage lower than that provided by the second power supply voltage terminal 70. In an example, the internal circuit 210 may comprise an N-type MOS transistor 212 and a P-type MOS transistor 214, as shown in FIG. 5. In another example, the internal circuit 210 may comprise logic gate cells, memory units, active elements or passive elements.

The current-limiting resistor 220 is coupled between the first-stage ESD protection circuit 240 and the second-stage ESD protection circuit 250, and the current-limiting resistor 220 is configured to limit the impact of the ESD voltage on internal circuit 210 to improve the ESD protection function in the CDM. The current-limiting resistor 220 is further configured to partially limit the ESD voltage applied to the second-stage ESD protection circuit 250, so as to reduce the possibility of damage to the second-stage ESD protection circuit 250 in an ESD event.

The power clamp 230 is coupled between the first power supply voltage terminal 60 and the second power supply voltage terminal 70, and is configured to discharge the static charge on the power supply rail and provide ESD protection performance.

The first-stage ESD protection circuit 240 is coupled between the first power supply voltage terminal 60 and the second power supply voltage terminal 70, and is configured to protect the internal circuit 210 in an ESD event without affecting the normal operation of the internal circuit 210. The first-stage ESD protection circuit 240 may comprise the ESD protection device 100 and two P-type diodes 242 connected in series, and the first diode 120 and the second diode 130 in the ESD protection device 100 are respectively N-type diodes (that is, the first-type can be P-type, and the second-type can be N-type).

The second-stage ESD protection circuit 250 is coupled between the first power supply voltage terminal 60 and the second power supply voltage terminal 70, and is coupled to the input/output pad 50 via the current-limiting resistor 220. The second-stage ESD protection circuit 250 is configured to protect the internal circuit 210 in an ESD event. In one embodiment, the configuration of the second-stage ESD protection circuit 250 is similar to the configuration of the first-stage ESD protection circuit 240, the second-stage ESD protection circuit 250 may comprise another ESD protection device 100 and two P-type diodes 252 connected in series, and the first diode 120 and the second diode 130 in the another ESD protection device 100 are respectively N-type diodes (that is, the first-type can be P-type, and the second-type can be N-type).

When an ESD capability test is performed on the integrated circuit 200, the ESD events can be classified into four switching modes according to the polarity of the electrostatic charge and discharge path: a PS mode (positive-to-VSS mode), an NS mode (negative-to-VSS mode), a PD mode (positive-to-VDD mode) and an ND mode (negative-to-VDD mode). When the integrated circuit 200 is tested in the PD mode, the second power supply voltage terminal 70 is grounded, a positive ESD voltage is applied to the input/output pad 50, the ESD current is discharged through the second power supply voltage terminal 70, and the first power supply voltage terminal 60 is floating. When the integrated circuit 200 is tested in the ND mode, the second power supply voltage terminal 70 is grounded, a negative ESD voltage is applied to the input/output pad 50, the ESD current is discharged through the second power supply voltage terminal 70, and the first power supply voltage terminal 60 is floating. When the integrated circuit 200 is tested in the NS mode, the first power supply voltage terminal 60 is grounded, a negative ESD voltage is applied to the input/output pad 50, the ESD current is discharged through the first power supply voltage terminal 60, and the second power supply voltage terminal 70 is floating. When the integrated circuit 200 is tested in the PS mode, the first power supply voltage terminal 60 is grounded, a positive ESD voltage is applied to the input/output pad 50, the ESD current is discharged through the first power supply voltage terminal 60, and the second power supply voltage terminal 70 is floating.

Figure 6:
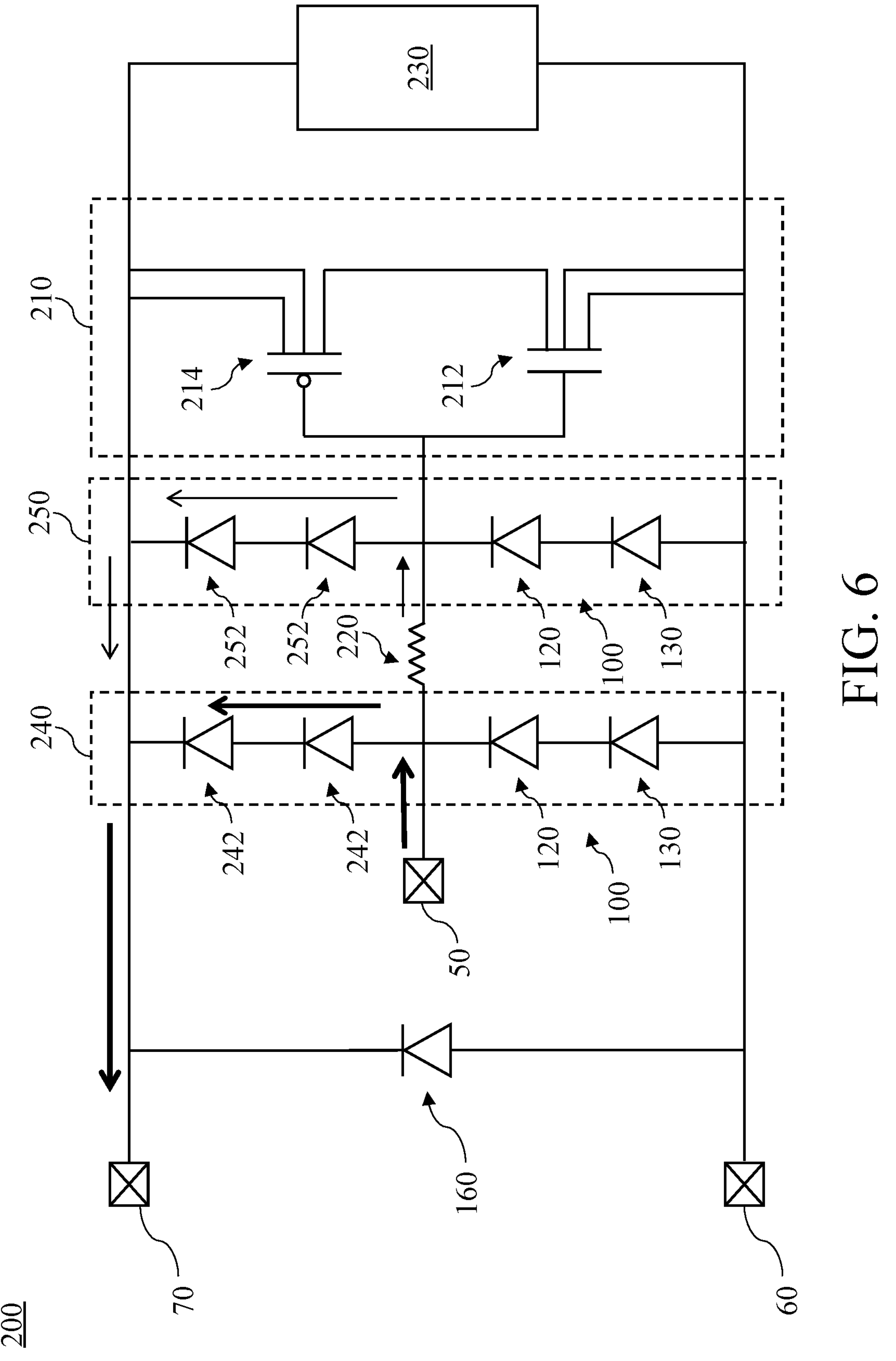
FIG. 6 is a schematic diagram of an ESD current when the integrated circuit of FIG. 5 is tested in a PD mode.

When the integrated circuit 200 is tested in the PD mode, the electrostatic charges are discharged from the input/output pad 50 to the second power supply voltage terminal 70 through the two P-type diodes 242 connected in series in the first-stage ESD protection circuit 240 and the two P-type diodes 252 connected in series in the second-stage ESD protection circuit 250, as shown by the arrows with sharp arrowheads in FIG. 6, wherein FIG. 6 is a schematic diagram of an ESD current when the integrated circuit of FIG. 5 is tested in a PD mode, the thickness of the arrow represents the magnitude of the current, the thick arrow with the sharp arrowhead represents the large current, and the thin arrow with the sharp arrowhead represents the small current. The current-limiting resistor 220 limits the ESD current flowing through the second-stage ESD protection circuit 250, and makes the ESD current flowing through the first-stage ESD protection circuit 240 larger than the ESD current flowing through the second-stage ESD protection circuit 250.

Figure 7:
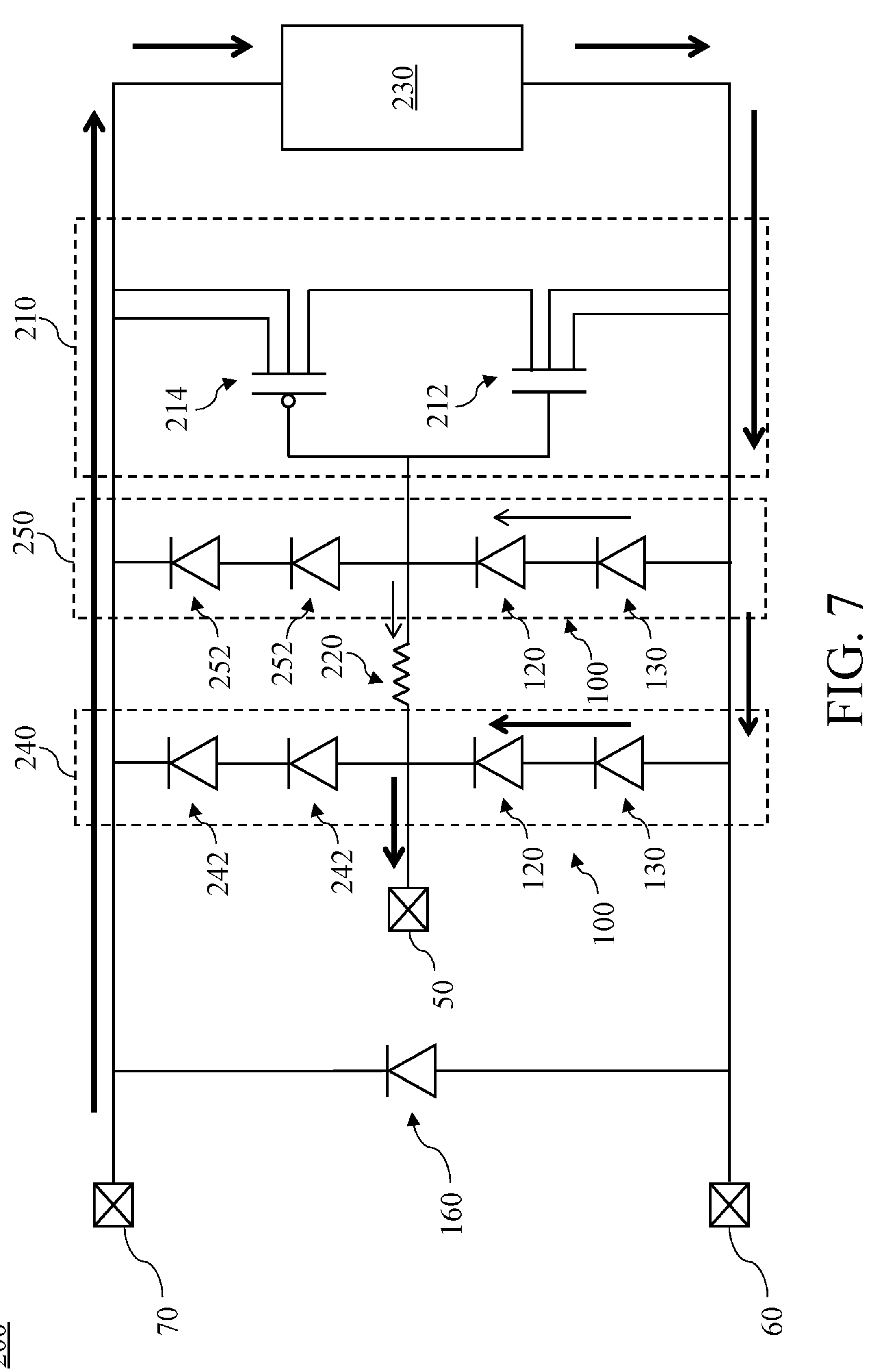
FIG. 7 is a schematic diagram of an ESD current when the integrated circuit of FIG. 5 is tested in a ND mode.

When the integrated circuit 200 is tested in the ND mode, the electrostatic charges are discharged from the second power supply voltage terminal 70 to the input/output pad 50 through the power clamp 230, the first diode 120 and the second diode 130 connected in series in the first-stage ESD protection circuit 240, and the first diode 120 and the second diode 130 connected in series in the second-stage ESD protection circuit 250, as shown by the arrows with sharp arrowheads in FIG. 7, wherein FIG. 7 is a schematic diagram of an ESD current when the integrated circuit of FIG. 5 is tested in a ND mode, the thickness of the arrow represents the magnitude of the current, the thick arrow with the sharp arrowhead represents the large current, and the thin arrow with the sharp arrowhead represents the small current. The current-limiting resistor 220 limits the ESD current flowing through the second-stage ESD protection circuit 250.

Figure 8:
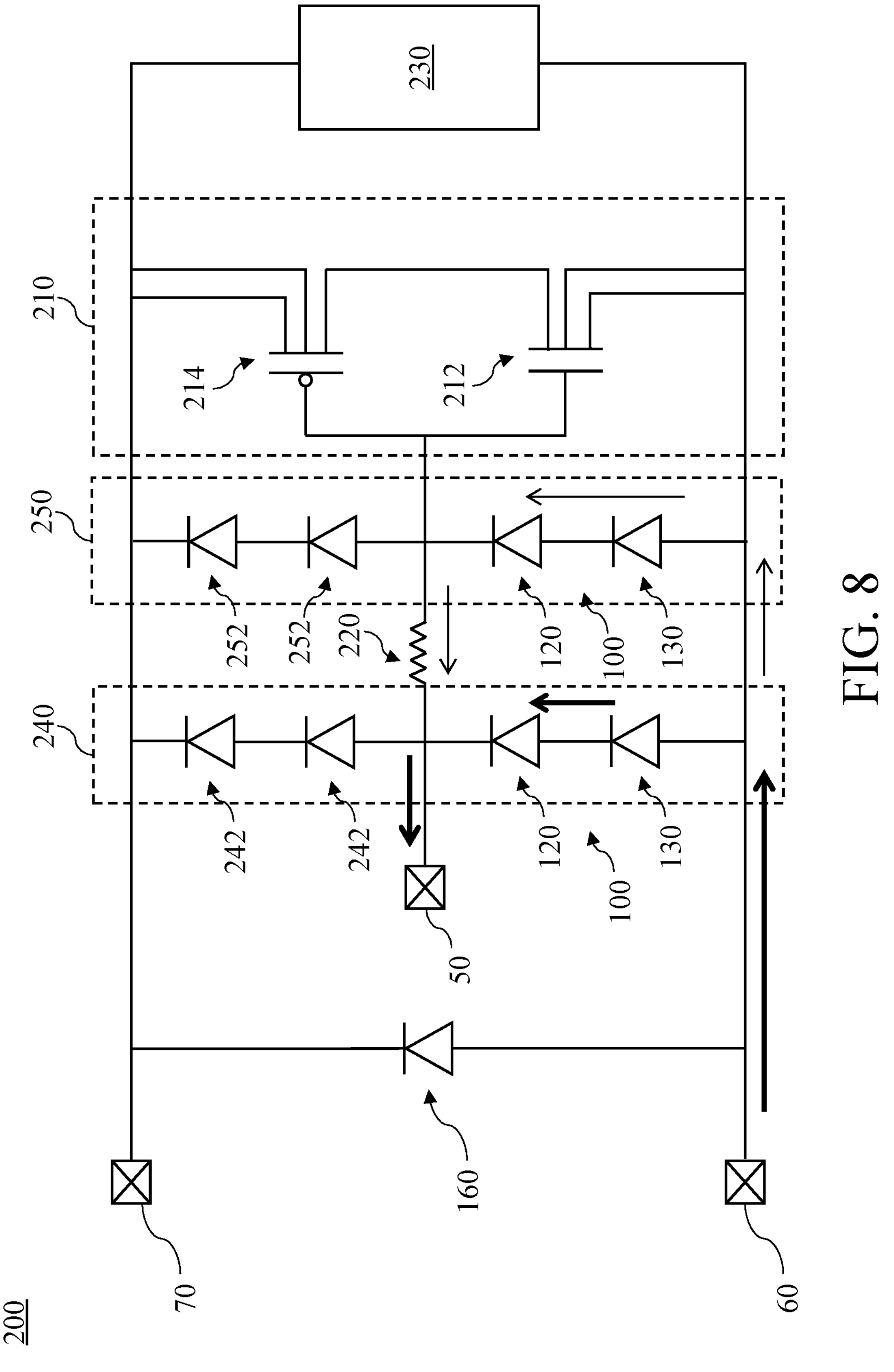
FIG. 8 is a schematic diagram of an ESD current when the integrated circuit of FIG. 5 is tested in a NS mode.

When the integrated circuit 200 is tested in the NS mode, the electrostatic charges are discharged from the first power supply voltage terminal 60 to the input/output pad 50 through the first diode 120 and the second diode 130 connected in series in the first-stage ESD protection circuit 240, and the first diode 120 and the second diode 130 connected in series in the second-stage ESD protection circuit 250, as shown by the arrows with sharp arrowheads in FIG. 8, wherein FIG. 8 is a schematic diagram of an ESD current when the integrated circuit of FIG. 5 is tested in a NS mode, the thickness of the arrow represents the magnitude of the current, the thick arrow with the sharp arrowhead represents the large current, and the thin arrow with the sharp arrowhead represents the small current. The current-limiting resistor 220 limits the ESD current flowing through the second-stage ESD protection circuit 250.

Figure 9:
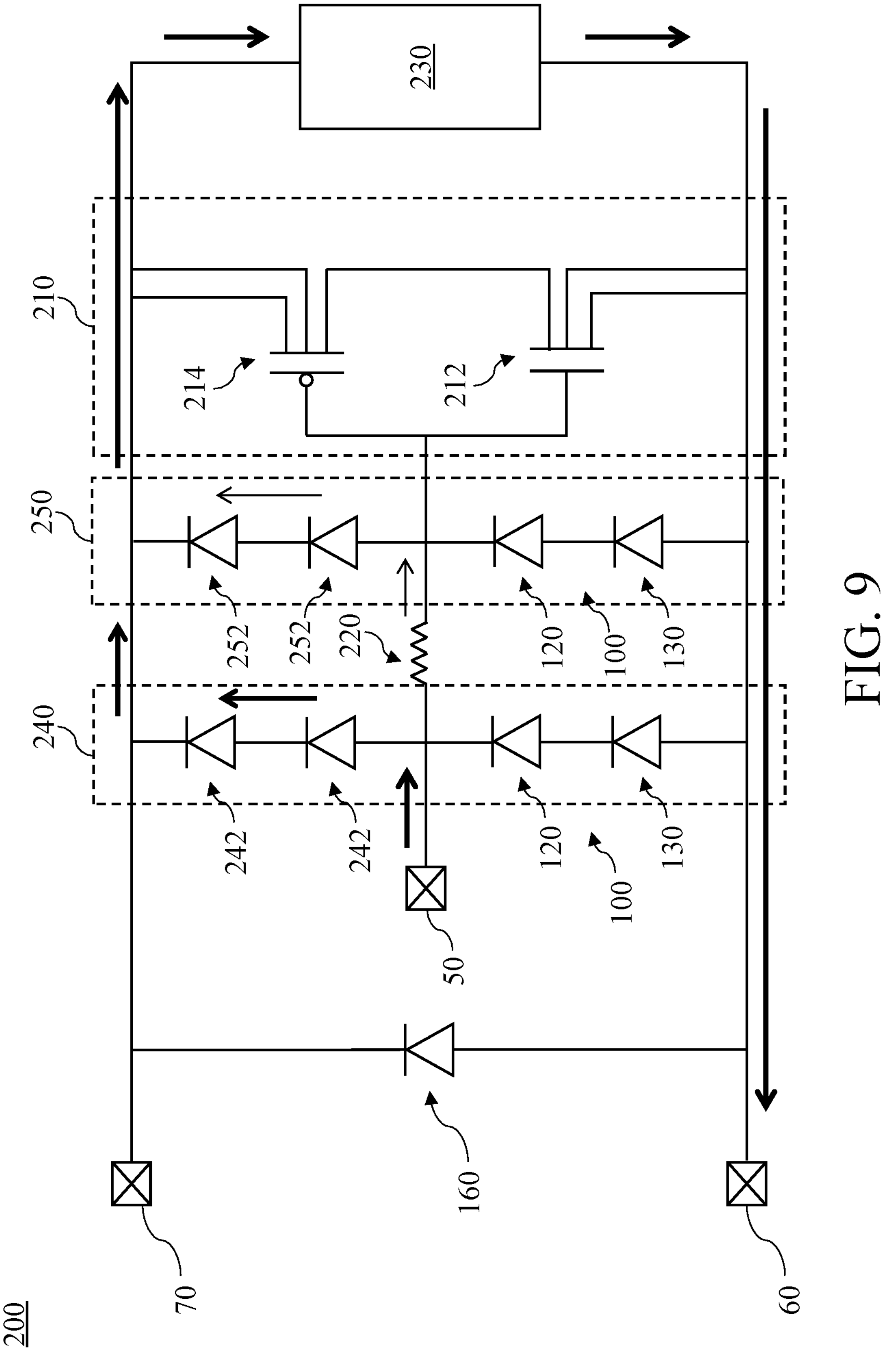
FIG. 9 is a schematic diagram of an ESD current when the integrated circuit of FIG. 5 is tested in a PS mode.

When the integrated circuit 200 is tested in the PS mode, the electrostatic charges are discharged from the input/output pad 50 to the first power supply voltage terminal 60 through the power clamp 230, the two P-type diodes 242 connected in series in the first-stage ESD protection circuit 240, and the two P-type diodes 252 connected in series in the second-stage ESD protection circuit 250, as shown by the arrows with sharp arrowheads in FIG. 9, wherein FIG. 9 is a schematic diagram of an ESD current when the integrated circuit of FIG. 5 is tested in a PS mode, the thickness of the arrow represents the magnitude of the current, the thick arrow with the sharp arrowhead represents the large current, and the thin arrow with the sharp arrowhead represents the small current. The current-limiting resistor 220 limits the ESD current flowing through the second-stage ESD protection circuit 250.

It can be known from the above that the ESD protection device 100 of the present disclosure can be used in the first-stage ESD protection circuit 240 and the second-stage ESD protection circuit 250 to realize ESD protection.

In summary, in the ESD protection device of the present disclosure, the first diode is electrically connected to the second diode through the metal wire above the first isolation structure (that is, the first diode and the second diode are connected in series), so that the ESD protection device has a lower parasitic capacitance value, which is suitable for a high-speed I/O port of the integrated circuit. In addition, the first diode is connected to the input/output pad of the integrated circuit through the first second-type well, and the second diode is connected to the first power supply voltage terminal of the integrated circuit through the second first-type well, so that the reverse breakdown voltage of the ESD protection device becomes larger, which improves the ESD protection capability. Moreover, by setting the second isolation structure, the first first-type well is isolated from the first region (that is, the first first-type well is isolated from the first-type semiconductor substrate), so that the conduction between the first diode and the second diode through the first-type semiconductor substrate is avoided, and the problem of low CDM performance is solved. Furthermore, the ESD protection device can be used in the first-stage ESD protection circuit and the second-stage ESD protection circuit to realize ESD protection.

While the present disclosure is disclosed in the foregoing embodiments, it should be noted that these descriptions are not intended to limit the present disclosure. On the contrary, the present disclosure covers modifications and equivalent arrangements obvious to those skilled in the art. Therefore, the scope of the claims must be interpreted in the broadest manner to comprise all obvious modifications and equivalent arrangements.

What is claimed is:

1. An electrostatic discharge protection device suitable for an integrated circuit comprising an input/output pad and a first power supply voltage terminal, comprising:

- a first-type semiconductor substrate, wherein an upper surface of the first-type semiconductor substrate comprises a first region, a second region, and a third region, and the third region is disposed between the first region and the second region;
- a first diode formed above the first region and comprising a first first-type well and a first second-type well, wherein the first second-type well is formed on a part of the first first-type well, and the first second-type well is connected to the input/output pad;
- a second diode formed on the second region and comprising a second first-type well and a second second-type well, wherein the second second-type well is formed on a part of the second first-type well, and the second first-type well contacts the second region and is connected to the first power supply voltage terminal;
- a first isolation structure formed on the third region to isolate the first diode from the second diode, wherein the first first-type well is electrically connected to the second second-type well through a metal wire above the first isolation structure; and
- a second isolation structure formed in the upper surface of the first-type semiconductor substrate and located under the first first-type well to isolate the first first-type well from the first region;
- wherein the first first-type well comprises a first first-type heavily-doped implanted region, and the first first-type heavily-doped implanted region is electrically connected to the second second-type well through the metal wire;
- wherein the bottom of the first first-type well is contacted with the second isolation structure, and the first first-type well and the second first-type well are configured in the same layer.

2. The electrostatic discharge protection device according to claim 1, wherein the second isolation structure is a second-type deep well.

3. The electrostatic discharge protection device according to claim 1, wherein the second isolation structure does not extend between the second first-type well and the second region.

4. The electrostatic discharge protection device according to claim 1, wherein a first voltage applied by the integrated circuit to the first second-type well of the first diode through the input/output pad is greater than a second voltage applied by the integrated circuit to the second first-type well of the second diode through the first power supply voltage terminal.

5. The electrostatic discharge protection device according to claim 1, wherein a shallow trench isolation (STI) structure is disposed between the first first-type heavily-doped implanted region and the first second-type well.

6. The electrostatic discharge protection device according to claim 1, wherein the first isolation structure comprises a second-type well and a second-type heavily-doped implanted region formed on the second-type well, the second-type well is immediately adjacent to the first first-type well and the second first-type well, each of two sides of the second-type heavily-doped implanted region is provided with a shallow trench isolation structure to isolate the second-type heavily-doped implanted region from the first first-type well and the second first-type well, and the second-type well and the second first-type well form a parasitic diode; the integrated circuit further comprises a second power supply voltage terminal, and the second-type heavily-doped implanted region is connected to the second power supply voltage terminal.

7. The electrostatic discharge protection device according to claim 6, wherein a third voltage applied by the integrated circuit to the second-type heavily-doped implanted region of the first isolation structure through the second power supply voltage terminal is greater than a first voltage applied by the integrated circuit to the first second-type well of the first diode through the input/output pad.

8. The electrostatic discharge protection device according to claim 1, wherein the first isolation structure is a trench isolation structure.

9. The electrostatic discharge protection device according to claim 1, wherein the first-type is P-type, and the second-type is N-type.

10. The electrostatic discharge protection device according to claim 1, wherein the first-type is N-type, and the second-type is P-type.

11. The electrostatic discharge protection device according to claim 1, wherein the second first-type well comprises a second first-type heavily-doped implanted region, a shallow trench isolation structure is disposed between the second first-type heavily-doped implanted region and the second second-type well, and the integrated circuit applies a second voltage to the second first-type heavily-doped implanted region of the second diode through the first power supply voltage terminal.

* * * * *